United States Patent
Patch et al.

(10) Patent No.: US 6,703,835 B2
(45) Date of Patent: Mar. 9, 2004

(54) SYSTEM AND METHOD FOR UNWRAPPING PHASE DIFFERENCE IMAGES

(75) Inventors: Sarah K. Patch, Milwaukee, WI (US); Tejaswini Shubhachint, Waukesha, WI (US); Graeme C. McKinnon, Hartland, WI (US); Sandhya Parameswaran, Gurnee, IL (US); Joseph K. Maier, Milwaukee, WI (US)

(73) Assignee: GE Medical Systems Global Technology Co. LLC, Waukesha, WI (US)

( * ) Notice: Subject to any disclaimer, the term of this patent is extended or adjusted under 35 U.S.C. 154(b) by 0 days.

(21) Appl. No.: 10/119,724

(22) Filed: Apr. 11, 2002

(65) Prior Publication Data

US 2003/0193335 A1 Oct. 16, 2003

(51) Int. Cl.⁷ .................................................. G01N 3/00
(52) U.S. Cl. ........................................................ 324/307
(58) Field of Search ................................ 324/307, 309, 324/314; 382/100, 103, 131; 600/410, 411

(56) References Cited

U.S. PATENT DOCUMENTS

| | | | |
|---|---|---|---|
| 4,720,679 A | * 1/1988 | Patrick et al. | 324/309 |
| 5,432,447 A | 7/1995 | Song | |
| 5,485,085 A | * 1/1996 | Sumanaweera et al. | 324/307 |
| 5,587,658 A | * 12/1996 | Sukumar | 324/309 |
| 5,642,047 A | 6/1997 | Bernstein | |
| 5,783,942 A | 7/1998 | Bernstein et al. | |
| 6,011,625 A | 1/2000 | Glass | |
| 6,091,243 A | * 7/2000 | Xiang et al. | 324/307 |
| 6,147,492 A | * 11/2000 | Zhang et al. | 324/309 |
| 6,150,973 A | * 11/2000 | Pritt | 342/25 |
| 6,177,795 B1 | * 1/2001 | Zhu et al. | 324/307 |
| 6,263,228 B1 | 7/2001 | Zhang et al. | |
| 6,459,922 B1 | * 10/2002 | Zhang | 600/410 |
| 6,466,016 B1 | * 10/2002 | Miyoshi | 324/312 |
| 6,515,476 B1 | * 2/2003 | Oshio et al. | 324/309 |

OTHER PUBLICATIONS

M. Chrobak, C. Durr, G. Woegi, et al. Correcting Phase Wraps in MRI Images in the Presence of Errors, preprint received Dec. 29, 2000.

(List continued on next page.)

*Primary Examiner*—Diego Gutierrez
*Assistant Examiner*—Dixomara Vargas
(74) *Attorney, Agent, or Firm*—Miles & Stockbridge P.C.; Edward J. Kondracki

(57) ABSTRACT

A method for processing digital images includes acquiring a phase difference image which includes one or more phase wraps, creating a modulated phase difference image from the phase difference image, comparing the modulated phase difference image to the phase difference image to locate areas in the phase difference image to be unwrapped, and unwrapping the phase difference image based on the areas located in the comparing step. The unwrapping step is performed by replacing wrapped pixels in the phase difference image with pixels in the modulated phase difference image plus an integer multiple of $\pi$. The integer multiplier is computed by comparing overlapping pixels in the image segments. This has a smoothing effect causing the wrapped pixels in the phase difference image to become unwrapped. As a result of this pixel replacement process, an image of improved quality and information content is produced compared with conventional methods.

34 Claims, 10 Drawing Sheets

OTHER PUBLICATIONS

Li An, Qing-San Xiang, and Sofia Chavez, "A Fast Implementation of The Minimum Spanning Tree Method for Phase Unwrapping," IEEE Transactions on Medical Imaging, vol. 19, No. 8, pp. 805–808, (200).

M. Hedley, D. Rosenfeld, "A New Two–Dimensional Phase Unwrapping Algorithm for MRI Images," Magnetic Resonance in Medicine, vol. 24, pp. 177–181, (1992).

S.M. Song, S. Napel, N.J. Pelc, G.H. Glover, "Phase Unwrapping of MR Images Using Poisson Equation," IEEE Transactions on Image Processing, pp. 667–676, (1995).

S.M. Song, S. Napel, N.J. Pelc, G.H. Glover, "A Least Squares Based Phase Unwrapping Algorithm for MRI," IEEE TMI, pp. 1784–1788, (1994).

J. Strand, T. Taxt, "Performance Evaluation of Two–dimensional Phase Unwrapping Algorithms," Applied Optics vol. 38 No. 20, pp. 4333–4344, (1999).

E. Schneider, G.H. Glover, "Rapid In–vivo Proton Shimming," Magnetic Resonance in Medicine vol. 18, pp. 335–347, (1991).

N.H. Ching, D. Rosenfeld, M. Braun, "Two–Dimensional Phase Unwrapping Using a Minimum Spanning Tree Algorithm," IEEE Transactions On Image Processing, vol. 1, No. 3, pp. 355–365, (1992).

* cited by examiner

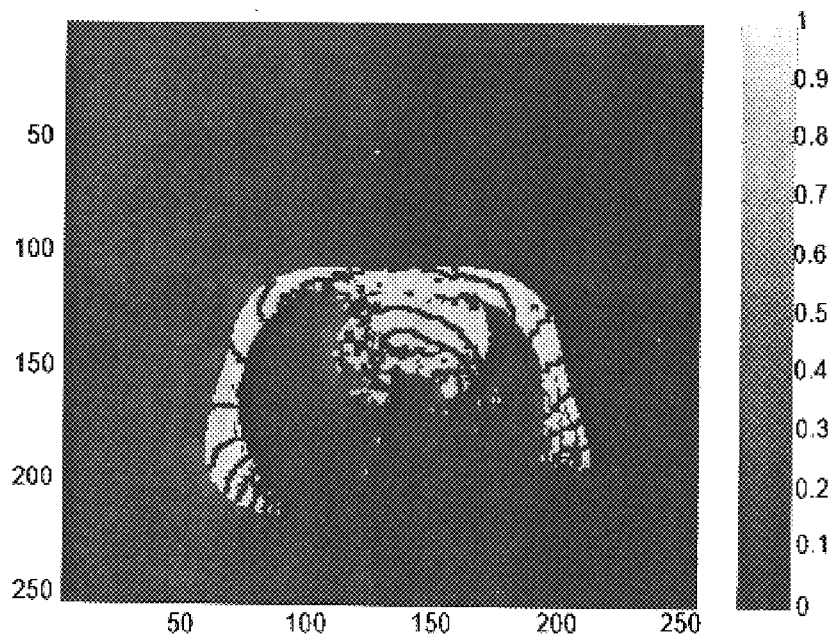
FIG. 5
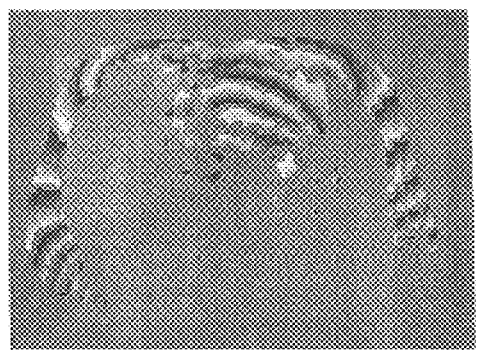 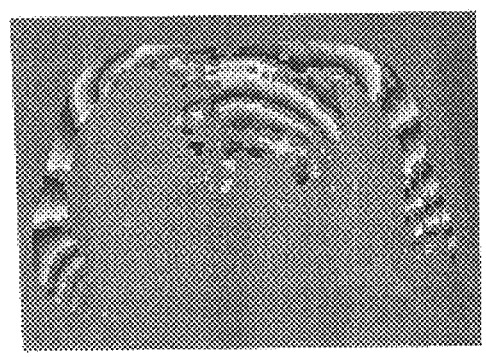
FIG. 6A  FIG. 6B

SYSTEM AND METHOD FOR UNWRAPPING PHASE DIFFERENCE IMAGES

BACKGROUND OF THE INVENTION

1. Field of the Invention

This invention generally relates to processing images, and more particularly to a system and method for unwrapping a phase difference image in order to produce an image of improved quality and information content.

2. Description of the Related Art

Computed imaging systems are employed in a wide variety of applications, including medical, astronomy and terrain analysis. The images produced by these systems often contain features known as phase wrap. These features diminish the quality of the image and therefore information content which might otherwise be discernable if the features were not present. While the concept of phase wrap is explained below in the specific context of a magnetic resonance imaging (MRI) system, those skilled in the art are aware that phase wrap may occur in other imaging modalities including computer tomography, ultrasound, synthetic aperture radar, and even radio astronomy.

Magnetic Resonance Imaging (MRI) is used to obtain digital images of the internal structure of an object (e.g., the human body) having substantial populations of atomic nuclei that are susceptible to nuclear magnetic resonance (NMR) phenomena. In MRI, a strong magnetic field is used to polarize nuclei in the object. These nuclei are then excited by a radio frequency (RF) signal at a particular NMR frequency. By spatially distributing the localized magnetic fields, and then analyzing the resulting RF responses, an image of relative NMR responses as a function of the location of the nuclei may be generated. Additional processing will allow this image to be displayed on a monitor for analysis by a doctor.

The excitation frequency may be defined by the Larmor relationship, which states that the angular frequency, $\omega_0$, of the precession of the nuclei is the product of the magnetic field, $B_0$, and the so-called magnetogyric ratio, $\gamma$, a fundamental physical constant for each nuclear species:

$$\omega_0 = B_0 \gamma$$

Accordingly, by superimposing a linear gradient field, $B_z = Z\, G_z$, on the static uniform field, $B_0$, which defined Z axis, for example, nuclei in a selected X-Y plane can be excited by a proper choice of the frequency spectrum of the transverse excitation field applied along the X or Y axis. Similarly, a gradient field can be applied in the X-Y plane during detection of free induction decay signals to spatially localize these signals in the plane. The angle of nuclei spin flip in response to an RF pulse excitation is proportional to the integral of the pulse over time.

It is well known that the magnetic resonance phase can serve as a measure of some physical quantity. Depending on the pulse sequence, the MR phase can, for example, represent the main $B_0$ field inhomogeneity which corresponds to phase wrap in the output image.

In order to improve image quality, phase unwrapping is often performed. Phase unwrapping refers to the process of determining the absolute phase of a complex signal given the measurement of its principal phase value. More succinctly, since the phase angle of a complex number is unambiguous only between $-\pi$ and $+\pi$, the phase of an image signal cannot be unambiguously determined from its argument.

In the context of an MRI system, phase unwrapping is a necessary tool for performing three-point Dixon water and fat separation and can be used to increase the dynamic range of phase contrast MR velocity measurements. Phase unwrapping has also been shown to be important in the context of other systems, such as synthetic aperture radar systems. See, for example, U.S. Pat. No. 6,011,625.

Various approaches have been proposed for performing phase unwrapping. One approach is based on a least-squares algorithm which determines the phase surface which best fits the ensemble of pixel-to-pixel phase differences over an interferogram. If inconsistencies are present, the least-squares process attempts to minimize deleterious effects by minimizing the residual fitting error.

Other approaches are based on a path-following algorithm. This algorithm numerically integrates the pixel-to-pixel phase differences over an interferogram, in the process of either avoiding or minimizing inconsistencies by selecting paths where error is minimized.

Another approach used specifically in MRI systems involves a combination of modeling the static magnetic field using polynomial functions as a guided phase unwrapping by region-growing. Such an approach is disclosed, for example, in U.S. Pat. No. 6,263,228.

The phase unwrapping approaches discussed above are either locally applied or remove a low-order approximation of the phase difference image in an effort to make the remaining high-order image wrap-free. By removing low frequencies from an image, some global information is taken into account but the assumption that the remaining high frequencies do not include any phase wraps is frequently incorrect, especially in so-called open MRI systems, and this is true even of geometrically simple phantoms. These techniques do not take into account global information without making a priori assumptions.

Local methods use nearest-neighbor pixels to determine whether a pixel should be unwrapped. Methods of this type are highly sensitive to phase errors. For example, a single pixel with an incorrect phase can cause a wrap to be streaked across the entire image. Local techniques which demonstrate this sensitivity include recursive routines and the Ahn technique, the latter of which streaks when applied column-by-column to two-dimensional phase difference images even when a little noise is present.

Open MRI systems are especially susceptible to image degradation caused by phase errors. Open MRI systems generate phase difference images which are more difficult to unwrap than tranditional cylindrical systems. In particular, the lower field strengths produced by these systems have degraded signal-to-noise ratio in the 0.7T OpenSpeed MRI system and the 0.5T Profile system compared to 1.5T cylindrical systems. Furthermore, fields generated by open MRI systems tend to be less homogenous than cylindrical systems and therefore generate phase difference images with many more wraps to be undone. Additionally, signal-to-noise is far worse in open MRI systems, which produce a larger number of phase errors. Because local unwrapping approaches look only at nearest neighbors when determining whether to unwrap a pixel, they are slow, extremely sensitive to phase errors, and therefore inadequate when applied to open MRI.

Conventional phase unwrapping approaches have also proven inadequate when applied to digital images in which noise is present. For example, because the measurements are corrupted, it is simply impossible to unwrap the image so the all nearest-neighbor pixel differences are smaller than $\pi$.

In view of the foregoing considerations, it is clear that there is a need for an improved method for unwrapping phase difference images including those in which noise is present, and more specifically one which may be applied more efficiently and with fewer errors compared with conventional methods.

SUMMARY OF THE INVENTION

The present invention is a system and method for processing digital images more efficiently and with fewer errors than conventional methods. The invention is especially well suited to processing digital images containing noise. The method includes acquiring a phase difference image which includes one or more wraps, creating a modulated phase difference image from the phase difference image, comparing the modulated phase difference image to the phase difference image to locate areas in said phase difference image to be unwrapped, and unwrapping the phase difference image based on the areas located in the comparing step. The modulated phase difference image may be created by rotating the phase difference image by a predetermined angle, and then registering the pixels in the rotated image so that values of the pixels lie within a desired phase range. The desired phase range may equal, for example, a phase range within which pixels of the phase difference image reside. The unwrapping step includes replacing wrapped pixels in the phase difference image with pixels in the modulated phase difference image.

The system of the present invention includes an imaging device, a storage unit for storing an image from the imaging device, and a processor for processing digital images in accordance with the method of the present invention. The processor may perform the method under control of a computer program stored in a memory unit of the system. The various images generated by the invention may be displayed on a monitor or other output device.

The system and method of the present invention is advantageous in a number of respects. One advantage results from the replacement step. Specifically, replacing pixels in the phase difference image with pixels in the modulated phase difference image will have a smoothing effect which will cause the wrapped pixels in the phase difference image to become unwrapped. This is because the replacement pixels in the modulated phase difference image represent rotated pixels in the phase difference image, which suffer no wraps near the phase wrap in the original image. As a result, an image of improved quality and information content is produced.

Further, the image segmentation steps of the invention may be applied to remove inconsistent pixels from the region to be unwrapped. In so doing, phase errors that would severely corrupt results of local phase unwrapping routines are advantageously eliminated. Another advantage is that the method of the present invention takes a global approach to phase unwrapping. This will allow AutoShim to be implemented in an open MRI system, and will make AutoShim more effective in traditional cylindrical MRI systems. Conventional methods cannot achieve these advantages because they are locally applied. The invention also may be applied to a wide variety of images, including magnetic resonance images derived from both cylindrical and open MRI systems, computed tomography images, X-ray images, ultrasound images, and images derived from a synthetic aperture radar system. These and other advantages and features of the invention are described in greater detail in the discussion which follows.

BRIEF DESCRIPTION OF THE DRAWINGS

FIG. 2A shows an MR magnitude image, FIG. 2B shows an MR phase difference image, FIG. 2C shows a magnitude mask, and FIG. 2D shows a masked phase difference image.

FIG. 5 shows an example of an image segmentation mask which may be used in association with the phase difference image shown in FIG. 2B.

FIGS. 6A and 6B respectively show segmented versions of the phase difference and modulated phase difference images $\phi_{meas}$ and $\phi_{mod}$ in accordance with the present invention.

DETAILED DESCRIPTION OF THE INVENTION

The present invention is a system and method for processing digital images, and more specifically for unwrapping a phase difference image produced, for example, from two original images. The phase difference image may be any one of a magnetic resonance image, a computed tomography image, an ultrasound image, an X-ray image, an astronomy-related image, an image generated by a synthetic aperture radar system, or the image may be any type of other phase difference image which requires processing for information recovery. The invention is especially well suited to unwrapping images generated by an open MRI system, however the invention is not in any way intended to be limited in this manner.

Figure 1:
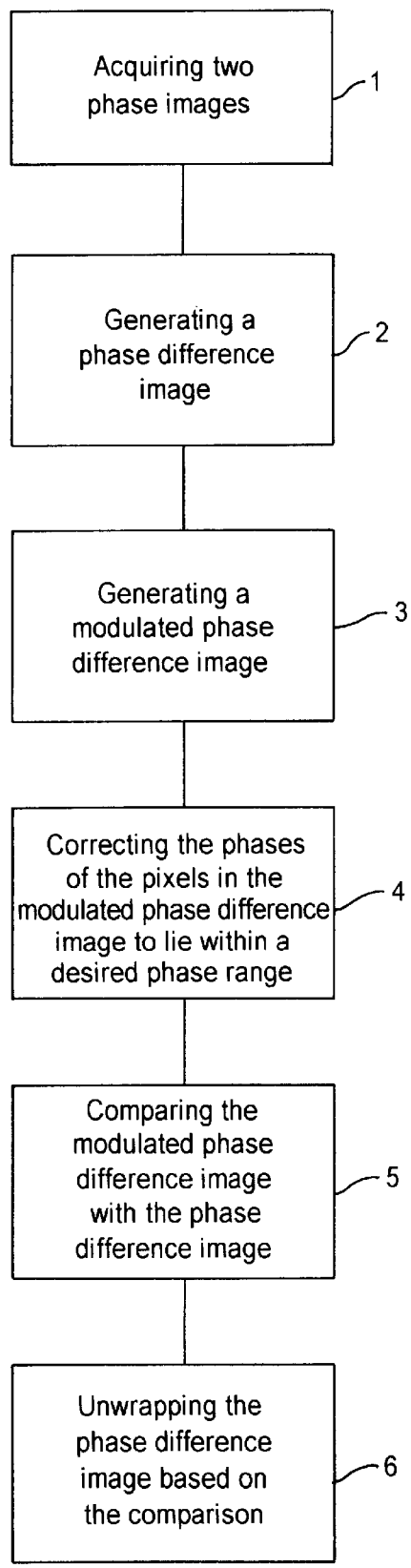
FIG. 1 is a flow diagram showing steps included in one embodiment of a method for processing digital images in accordance with the present invention.

Referring to FIG. 1, an embodiment of the method of the present invention includes as an initial step acquiring two phase images. (Block 1). The two phase images may be obtained using known techniques, which, for example, may include scanning a particular location of a patient's body with a medical imaging machine, scanning a particular area with a synthetic aperture radar, or using various other imaging systems.

A second step includes generating a phase difference image from the two phase images acquired in the initial step. (Block 2). The phase difference image may be measured as:

$$\phi_{meas} = \phi \bmod 2\pi \qquad (1)$$

wherein $\phi_{meas}$ corresponds to a measured phase difference image which lies in a phase range of between $-\pi$ and $+\pi$. In equation (1), mod is a function which reduces $\phi$ (taking on all real values between $-\infty$ and $+\infty$) to a related function $\phi_{meas}$, which takes on values between $-\pi$ and $+\pi$ only. By way of example, if $(f+2\pi) \bmod 2\pi = f$ where f is any function, then $(3+2\pi) \bmod 2\pi = 3$. A phase difference image according to this equation may be produced using conventional techniques.

One such technique involves varying an imaging parameter between the two phase images, so that the respective phases of those images are different. For example, in phase contrast angiography (also known as phase mapping) where flow velocity along an axis is to be measured, the value of the first gradient moment along the axis is varied to produce two different data sets. One of the phase images is then subtracted from the other, on a pixel-by-pixel basis, to provide the phase difference image.

Another technique, applied in MRI applications, creates a phase difference image by taking two magnetic resonance images with different gradient echo times (TEs), so that the images have the same magnitudes but different phases:

$$im_1(x) = \rho(x) e^{iTE\phi(x)}$$

$$im_2(x) = \rho(x) e^{i(TE+\Delta TE)\phi(x)}$$

When the natural log (ln) of the ratio of the above equations is taken and then divided by $\Delta TE$, the phase difference image, $\phi(x)$, is recovered as:

$$\ln(im2/im1)/\Delta TE = \phi(x)$$

Because the magnitude of each pixel in (im2/im1) is identically 1, it may be said that the magnitude, or intensity image, has been stripped away.

In performing the foregoing MRI-based technique, it may be advantageous to generate the phase difference image using a mask in order to remove noise. The reason for this is as follows. MRI images of patients often contain regions that are "air" therefore produce no MRI signal. Pixels in these regions have wildly varying phases which are physically meaningless. In accordance with one aspect of the invention, an MR magnitude image may be used to create an image mask which throws out all pixels with magnitude image values below a given threshold. This resulting masked image may then be used to perform the patching process in accordance with subsequent steps of the method, to be discussed in greater detail below.

Figure 2A:
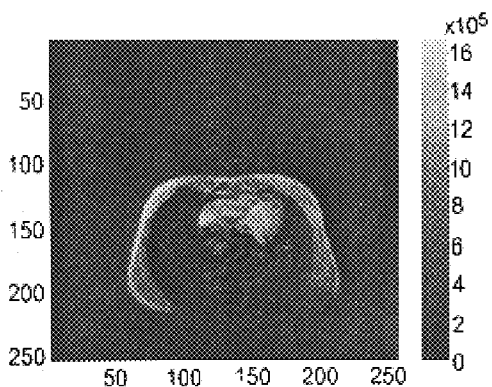
FIGS. 2A–2D show various stages in the development of a masked phase difference image, where
Figure 2B:
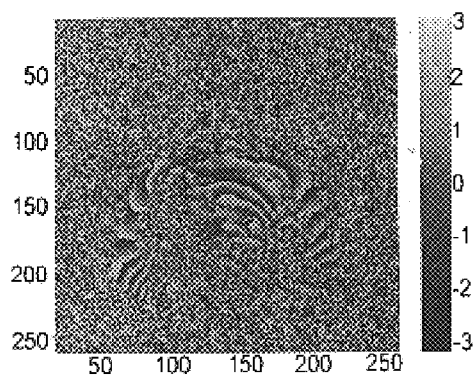
Figure 2C:
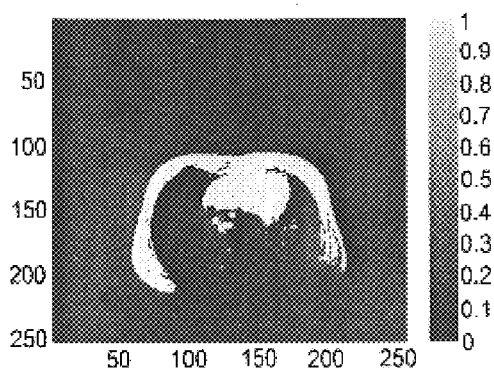
Figure 2D:
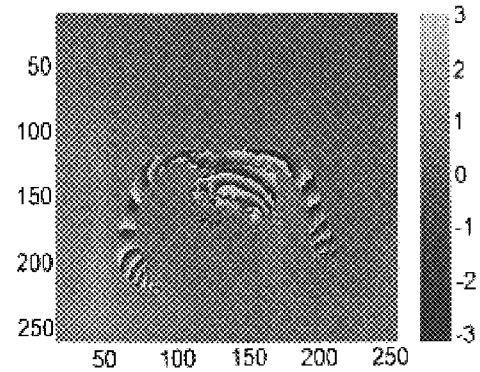

The generation of a masked image is illustratively shown in the images of FIGS. 2A–2D. FIG. 2A shows an MR magnitude image with image values lying in the range of 0 to $2 \times 10^5$. FIG. 2B shows a phase difference image containing noise in regions of low magnitude. FIG. 2C shows a magnitude mask having only those pixels in the MR magnitude image which lie above some threshold (e.g., max (magnitude image)/4)). The pixels in the magnitude mask corresponding to the pixels in the magnitude image which satisfy the threshold condition are set to 1; all other pixels are given a value of 0. FIG. 2D shows a masked phase difference image, generated by taking a pixel-by-pixel product of the magnitude mask shown in FIG. 2C with the phase difference image shown in FIG. 2B. As is evident from FIG. 2D, most of the "noisy" pixels have been removed by the mask. Those skilled in the art can appreciate that other techniques may be used for generating the phase difference image processed in accordance with the present invention.

The phase difference image produced from the foregoing steps may have one or more phase wraps which degrade image quality and information recovery. The method of the present invention takes the following steps to remove these effects.

A third step includes generating a modulated phase difference image from the phase difference image generated in the second step. (Block 3). In accordance with the present invention, the modulated phase difference image is generated by rotating a phase angle of the phase difference image by a predetermined angle, which lies within a range of between 0 and $2\pi$ but preferably corresponds to $\pi$. Rotating the phase difference image in this manner will allow unwrapped pixels located near an area of wrapped pixels to be substituted for the wrapped pixels in that area. This substitution, or patching process, will result in smoothing the area where the wrapped pixels are located, thereby improving the information content at that area and thus the overall quality of the image.

In mathematical terms, the phase difference image may be modulated according to the following equation:

$$\phi_{mod} = (\phi_{meas} + \theta) \bmod 2\pi \qquad (2)$$

where $\phi_{mod}$ is the modulated phase difference image, $\phi_{meas}$ is the phase difference image, and $\theta$ is the predetermined angle of rotation. When $\theta = \pi$ in equation (2), we therefore have by construction the following equation: $\phi_{mod} = \phi_{meas} \pm \pi$ where $\phi_{meas} \in [-\pi, +\pi)$, or equivalently $-\pi \leq \phi_{meas} \leq +\pi$. Also, $\phi_{mod} \in [-\pi, +\pi)$, or equivalently $-\pi \leq \phi_{mod} \leq +\pi$.

A fourth step is performed after the phase difference image has been rotated. In the fourth step, the phases of the pixels in the rotated image, $\phi_{mod}$, may be corrected to lie within the phase range of the phase difference image. (Block 4). The phase range is between $-\pi$ and $+\pi$. Correction to within this range may be accomplished, for example, by subtracting $2\pi$ from all pixels in the rotated image which exceed a phase of $\pi$.

Figure 3:
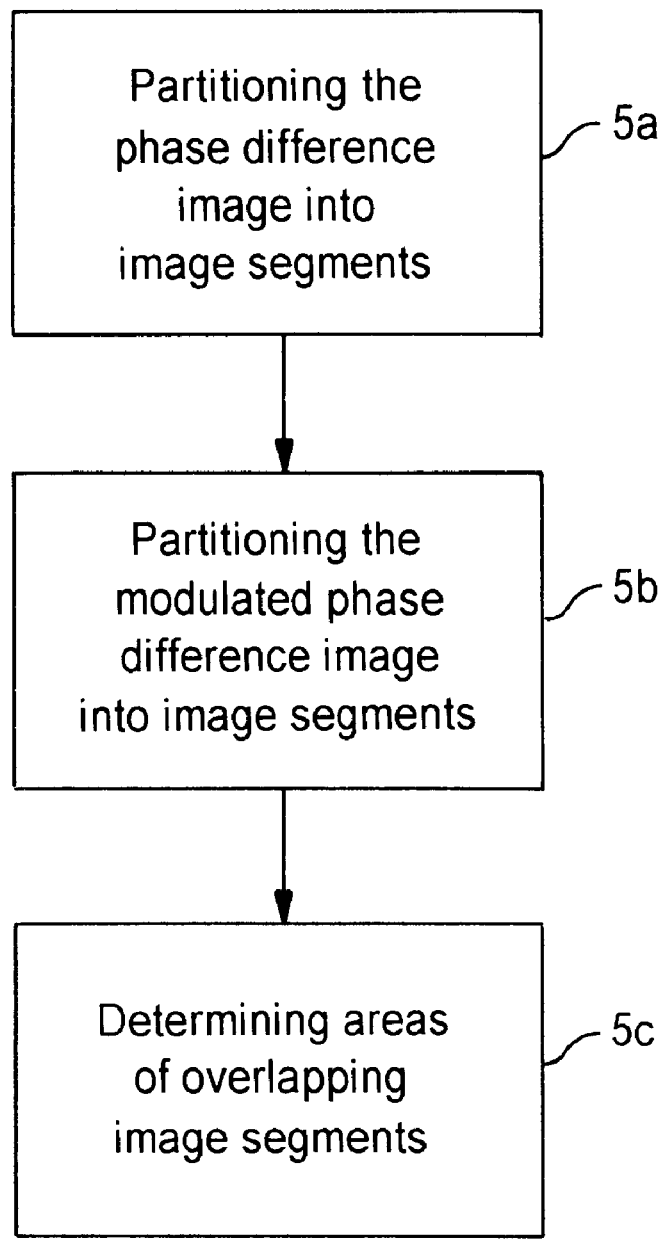
FIG. 3 is a flow diagram showing additional steps included in the aforementioned embodiment of the method of the present invention.

A fifth step includes comparing the modulated phase difference image, $\phi_{mod}$, to the phase difference image, $\phi_{meas}$, to locate areas in the phase difference image to be unwrapped. (Block 4). Referring to FIG. 3, this comparing step may include partitioning the phase difference image into a number of image segments (Block 5a), and then performing a similar partitioning for the modulated phase difference image (Block 5b). The number of image segments may be two or greater, and the phase difference image and the modulated phase difference image may be partitioned into different numbers of image segments.

Figure 4A:
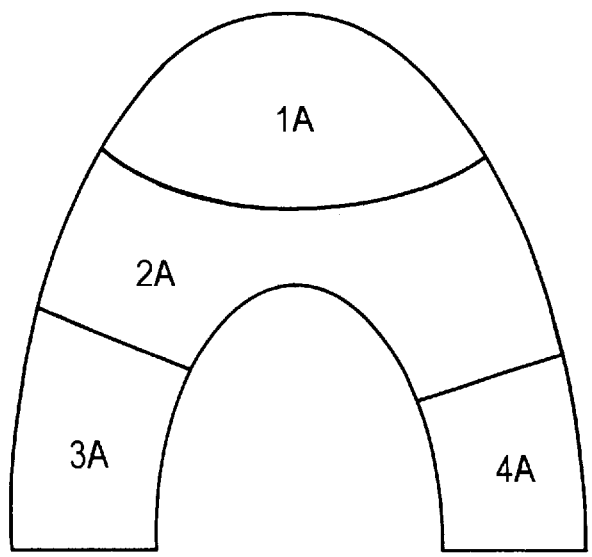
FIG. 4A shows an example of how a phase difference image $\phi_{meas}$ may be segmented in accordance with the present invention.
Figure 4B:
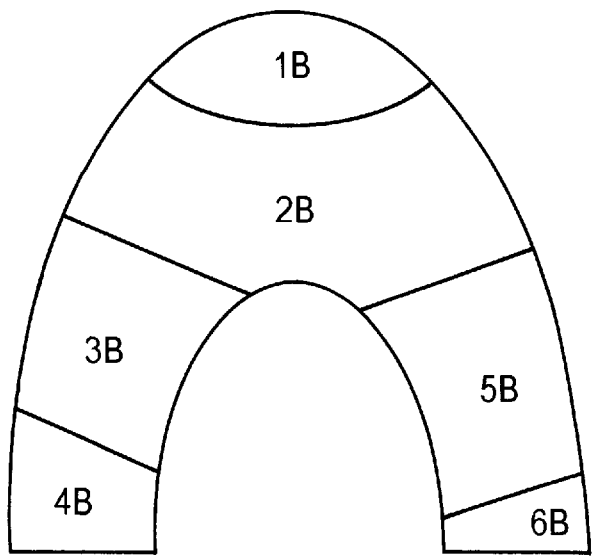
FIG. 4B shows an example of how a modulated phase difference image $\phi_{mod}$ may be segmented in accordance with the present invention.

FIGS. 4A and 4B show an MRI-specific example of the way in which the phase difference and modulated phase difference images may be partitioned into segments in accordance with the present invention. In FIG. 4A, the phase difference image, which is in the shape of a convex collection of pixels, is schematically partitioned into four image segments labeled Segments 1A through 4A. In FIG. 4B, the modulated phase difference image, which has exactly the same shape, is schematically partitioned into six image segments labeled Segments 1B through 6B. The image segments are numbered in no particular order and equally numbered segments have different coverage areas, although those areas may have overlapping pixels. Furthermore, while a convex shape is shown, the shape of the phase difference and modulated phase difference images may be any shape including those which are not convex.

The masked phase difference image and the modulated phase difference image may be segmented into unwrapped regions. This may be accomplished by "masking out" pixels located near wraps. The location of the wraps may be determined using a standard high-pass filter, and "wrapped" pixels may be identified as pixels whose values differ from any one of their nearest neighbors by some threshold amount. The threshold amount may be, for example, $\pi/2 = 25\%$ of the $2\pi$ phase range. Using this standard, only pixels with values differing by $\pi/2$ from one of its nearest neighbors are masked out. This choice of threshold is not unique and can be altered without significantly changing the invention. It is preferable to choose a small threshold so that a large number of pixels will be masked out. This is beneficial because pixels suffering large errors due to noise are masked out.

Figure 6C:
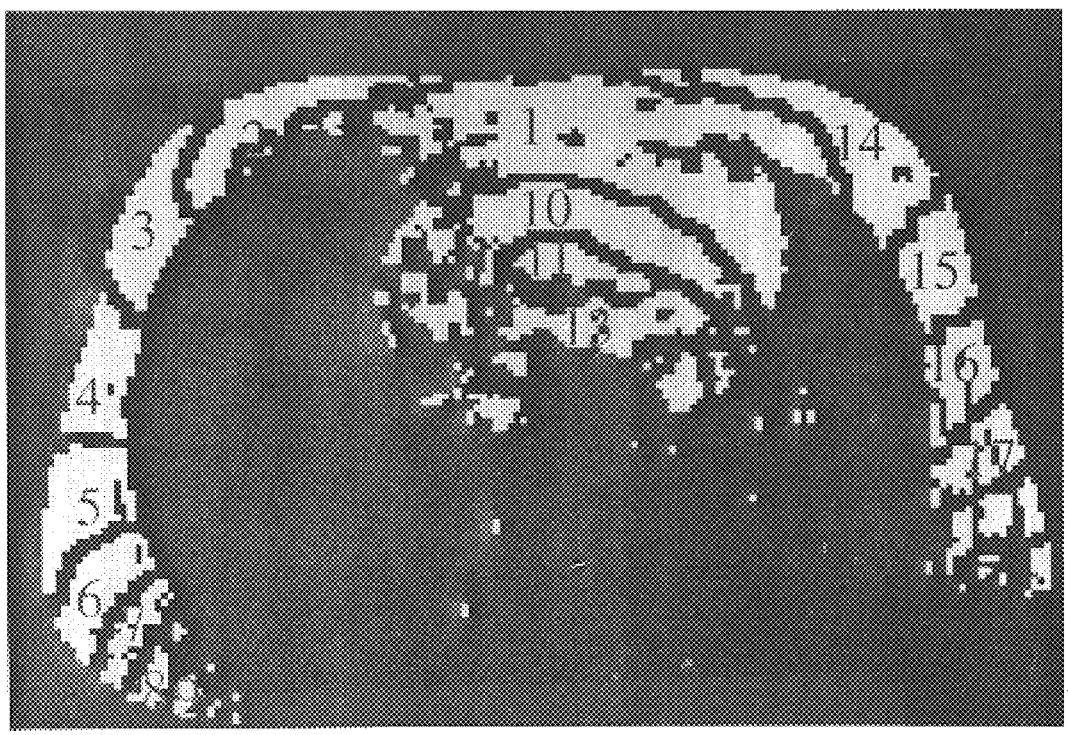
FIG. 6C shows segment numbers superimposed on the modulated phase difference image shown in FIG. 6B.

FIG. 5 shows an example of an image segmentation mask which may be used in association with the phase difference image shown in FIG. 2B. The image which resulted from applying the segmentation mask to the phase difference image is shown in FIG. 2D. By using this mask, the phase wraps in each individual segment of the image may be completely removed. FIGS. 6A and 6B respectively show segmented versions of the images $\phi_{mod}$ and $\phi_{meas}$ in connection with this example. FIG. 6C shows segment numbers superimposed on the modulated phase difference image shown in FIG. 6B.

Figure 7:
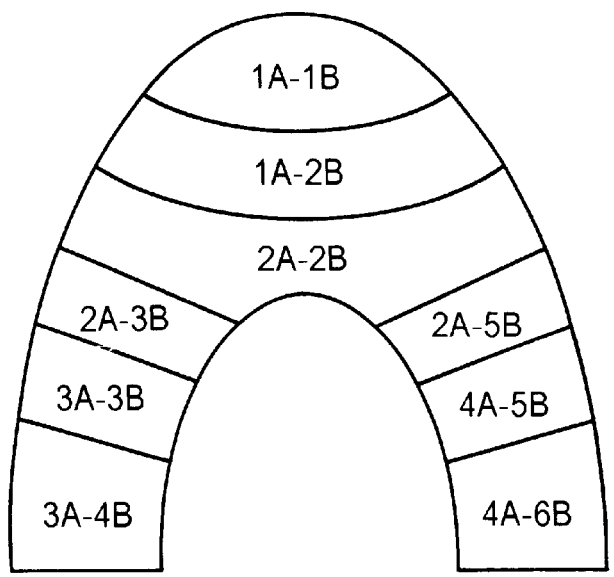
FIG. 7 is a diagram showing overlapping image segments created between the phase difference image and the modulated phase difference image generated in accordance with the present invention.

Returning to FIG. 3, the comparing step of the invention further includes determining areas where the image segments in the phase difference image overlap the image segments in the modulated phase difference image. (Block 5c). FIG. 7 shows an example of how these overlapping areas may be determined. In this figure, area 1A–1B corresponds to an area where image segment 1A in the phase difference image overlaps image segment 1B in the modulated phase difference image; area 1A–2B corresponds to an area where image segment 1A in the phase difference image overlaps image segment 2B in the modulated phase difference image; area 2A–2B corresponds to an area where image segment 2A in the phase difference image overlaps image segment 2B in the modulated phase difference image; area 2A–5B corresponds to an area where image segment 2A in the phase difference image overlaps image segment 5B in the modulated phase difference image; area 4A–5B corresponds to an area where image segment 4A in the phase difference image overlaps image segment 5B in the modulated phase difference image; area 4A–6B corresponds to an area where image segment 4A in the phase difference image overlaps image segment 6B in the modulated phase difference image; area 2A–3B corresponds to an area where image segment 2A in the phase difference image overlaps image segment 3B in the modulated phase difference image; area 3A–3B corresponds to an area where image segment 3A in the phase difference image overlaps image segment 3B in the modulated phase difference image; and area 3A–4B corresponds to an area where image segment 3A in the phase difference image overlaps with image segment 4B in the modulated phase difference image. This step may be simultaneously performed during the unwrapping step, which will now be discussed.

Figure 8:
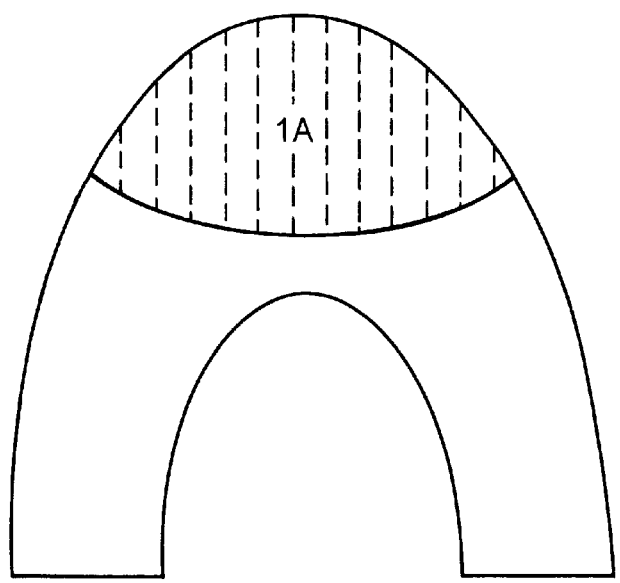
FIG. 8 is a diagram showing a first image segment unwrapped in accordance with the present invention.

A sixth step of the method includes unwrapping the phase difference image based on the areas located in the comparing step. First, an initial image segment in the phase difference image is selected, which, for example, may correspond to image segment 1A in FIG. 4A. This image segment is then used to form the first image segment in the unwrapped phase difference image. More specifically, the unwrapped phase difference image is initialized to be identically zero except for pixels corresponding to selected image segment in the phase difference image. This initial image segment is unwrapped by construction, e.g., by removing all the wrapped pixels in the selected image segment so that there are no longer any wraps in this segment. The portion of the unwrapped phase difference image which results after this initial step is illustratively shown in FIG. 8, where shaded segment 1A corresponds to the first unwrapped segment in the unwrapped phase difference image.

In a next step, an image segment in the modulated phase difference image is selected which overlaps unwrapped image segment 2A in the phase difference image. An overlapping image segment may be identified, for example, using a computer program which performs the comparison performed in the comparing step to determine these overlapping segments. As an example, the overlapping image segment identified by this program may be image segment 2B in the modulated phase difference image shown in FIG. 4B. This overlapping area corresponds to the area 2A–2B in FIG. 7.

Figure 9:
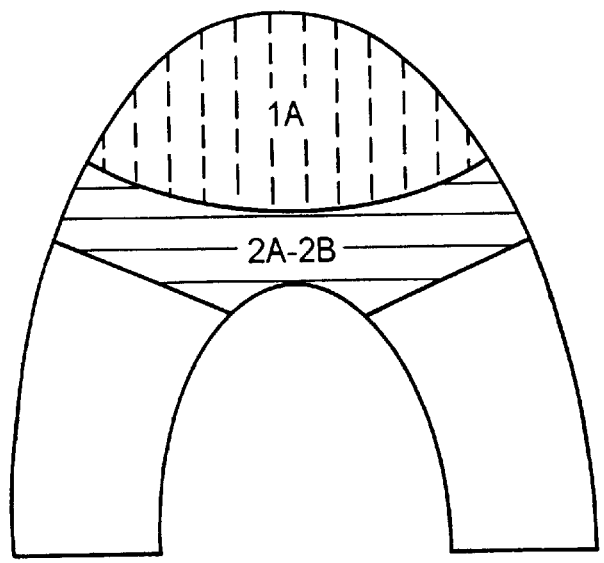
FIG. 9 is a diagram showing another image segment unwrapped in accordance with the present invention.

Once this overlapping image segment is identified, pixels in the phase difference image located in the overlapping image segment are replaced by the pixels in image segment 2B of the modulated phase difference image, plus an integer multiple of $\pi$. This integer multiple may be computed by comparing overlapping pixels in the image segments as explained in the discussion which follows. The result of this step is to produce unwrapped area 2A–2B as illustratively shown in FIG. 9.

Replacing pixels in the phase difference image with pixels in the modulated phase difference image plus an integer multiple of $\pi$ will have a smoothing effect which will cause the wrapped pixels in the phase difference image to become unwrapped. This is because the replacement pixels in the modulated phase difference image represent rotated pixels in the phase difference image, which suffer no wraps near the phase wrap in the original image. Therefore, it is easy to infer from the modulated phase difference image, the amount by which these pixels should be shifted. Iteratively performing pixel replacement (patching) in this manner extends the unwrapped phase difference image without introducing phase wraps. (Note that not all pixels in the original phase difference image are necessarily unwrapped by this process. Some may be left identically zero.)

The image resulting from the pixel replacement performed in the foregoing steps may be referred to as the unwrapped phase difference image, represented as $\Phi_{uw}$. At this point, however, only the portion of the phase difference image which correspond to segments 1A–1B, 1A–2B, and 2A–2B in FIG. 7 are considered unwrapped. In subsequent steps, successive iterations are performed to unwrap the remaining portions of the phase difference image. This involves filling the remaining portions with unwrapped pixels until a final unwrapped phase difference image is produced. These subsequent steps may be performed as follows.

Figure 10:
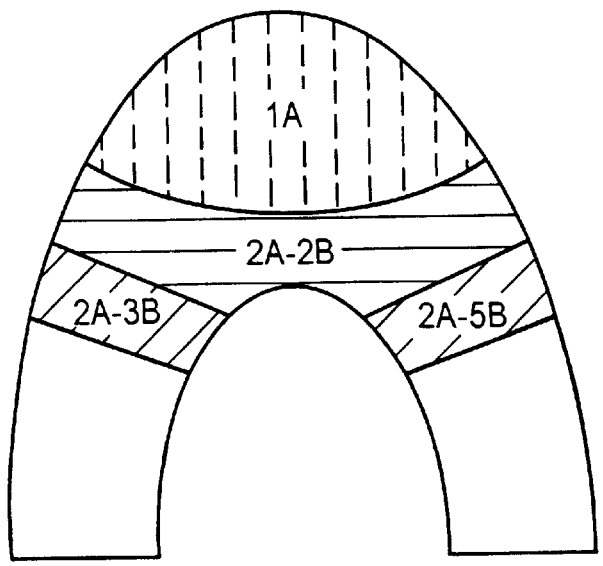
FIG. 10 is a diagram showing another image segment unwrapped in accordance with the present invention.

In a next step, areas in the phase difference image which correspond to image segments 2A–3B and 2A–5B in FIG. 7 are successively or simultaneously unwrapped. This involves replacing the pixels in the phase difference image located in areas 2A–3B and 2A–5B with pixels in the modulated phase difference image which are also located in these areas plus an integer multiple of $\pi$. The result of this replacement is shown in FIG. 10, where areas labeled 2A–3B and 2A–5B are now considered to be unwrapped in $\Phi_{uw}$.

Figure 11:
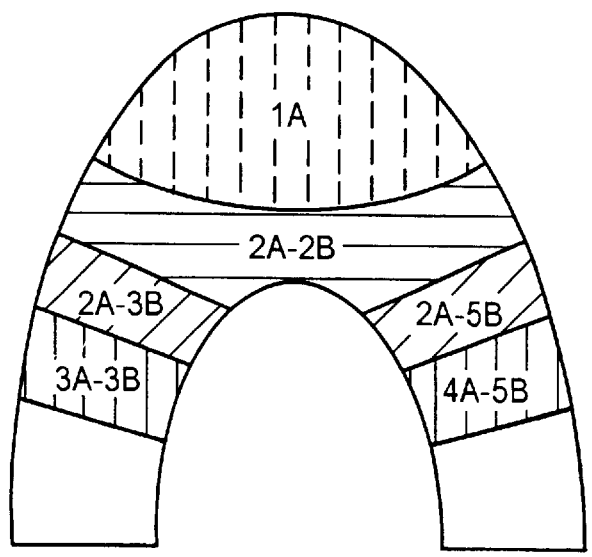
FIG. 11 is a diagram showing another image segment unwrapped in accordance with the present invention.

In a next step, areas in the phase difference image which correspond to image segments 3A–3B and 4A–5B in FIG. 7 are successively or simultaneously unwrapped. This involves replacing the pixels in the phase difference image located in areas 3A–3B and 4A–5B with pixels in the modulated phase difference image which are also located in these areas plus an integer multiple of π. The result of this replacement is shown in FIG. 11, where areas labeled 3A–3B and 4A–5B are now considered to be unwrapped in $\Phi_{uw}$.

Figure 12:
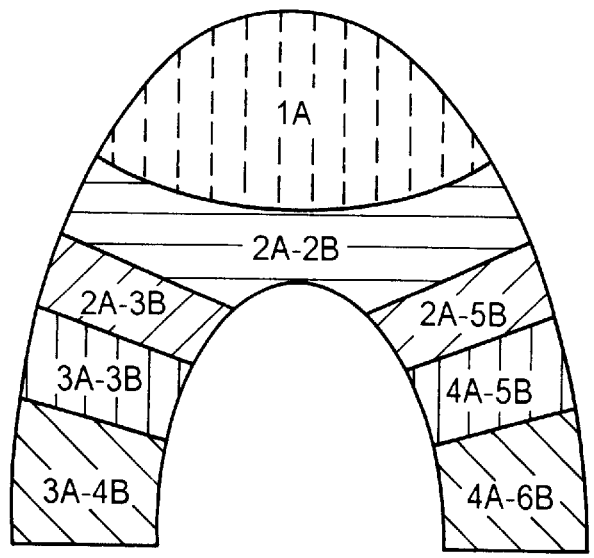
FIG. 12 is a diagram showing another image segment unwrapped in accordance with the present invention.

In a next step, areas in the phase difference image which correspond to image segments 3A–4B and 4A–6B in FIG. 7 are successively or simultaneously unwrapped. This involves replacing the pixels in the phase difference image located in areas 3A–4B and 4A–6B with pixels in the modulated phase difference image which are also located in these areas plus an integer multiple of π. The result of this replacement is shown in FIG. 12, where areas labeled 3A–4B and 4A–6B are now considered to be unwrapped in $\Phi_{uw}$. While it is generally preferred that the order for unwrapping image segments proceeds from largest to smallest, those skilled in the art can appreciate that the order in which the image segments are unwrapped may be varied as desired. For example, image segments 2A–5B, 4A–5B, and 4A–6B may be unwrapped before segments 2A–3B, 3A–3B, and 3A–4B.

Through this systematic, iterative pixel replacement approach, the system and method of the present invention unwraps phase difference images more efficiently and with fewer errors than conventional methods. This is because the invention takes a global approach to phase unwrapping which is extremely robust to noise. In contrast, conventional methods are local in nature and therefore cannot achieve these advantages.

In mathematical terms, and by way of example, the pixel replacement steps discussed above may be performed in the following manner:

a) For a first segment in the phase difference image, initialize $\phi_{uw}$ to be that segment surrounded by zeros and determine the pixels that overlap between unwrapped phase difference image $\phi_{uw}$ and the modulated phase difference image $\phi_{mod}$.

b) For each segment of $\Phi_{mod}$ containing pixels determined in step a), compute Δφ, which is the average difference between the values of the unwrapped phase difference image $\phi_{uw}$ and this particular segment of the modulated phase difference image $\phi_{mod}$ on the pixels determined in step a). Ideally, Δφ is an integer multiple of π, i.e., Δφ=mπ, for some integer m. In practice, Δφ may not be quite an integer multiple.

c) Compute the nearest integer, m, to which Δφ is a multiple of π, where m=round(Δφ/π).

d) Replace pixels in $\phi_{uw}$ which are in the overlapping segment of the phase difference image but which are not already unwrapped with pixels having values of $\phi_{mod}$+mπ.

e) Repeat this pixel replacement process (steps b), c), and d)) for all remaining overlapping segments that exist between the unwrapped image and alternately the modulated phase difference image and measured phase difference image.

Figure 13:
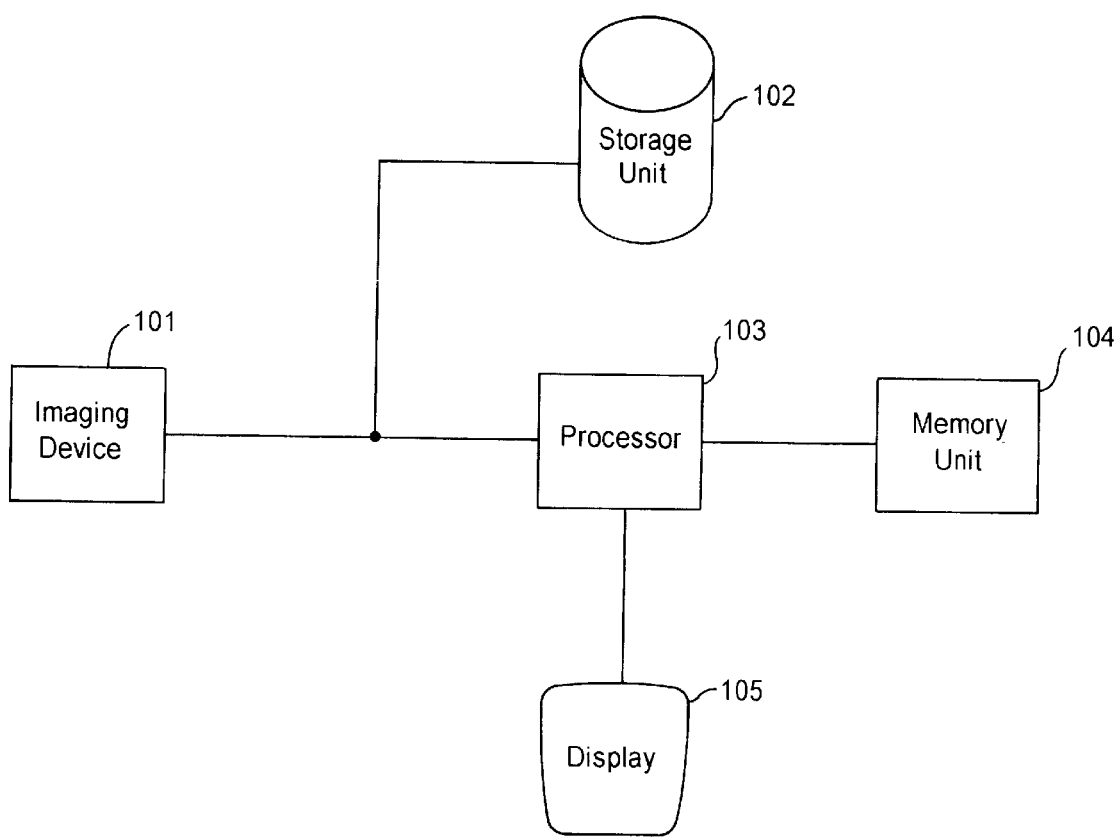
FIG. 13 is a diagram showing one embodiment of a system for processing digital images in accordance with the present invention.

FIG. 13 shows an embodiment of the system 100 for processing digital images in accordance with the present invention. The system includes an imaging device 101 for capturing a digital image including any of the types previously described, a storage device 102 for storing the digital image, and a processor 103 for processing the digital image in accordance with the steps of the method of the present invention. The steps of the invention may be performed by a computer program stored in a memory unit 104 of the system. A display monitor 105 or other output device may also be included to show the various images generated by the invention including the final unwrapped phase difference image.

By taking this global approach to phase unwrapping, the system and method of the present invention will allow AutoShim to be implemented in an open MRI system, and will make AutoShim more effective in traditional cylindrical MRI systems. This may be understood as follows.

AutoShim is a correction step performed just before scanning a patient. The primary purpose of AutoShim is to correct background field inhomogeneities created by the patient. (The patient actually perturbs the experimental setup.) When the background field has relatively large inhomogeneity, then AutoShim also works to reduce the background field inhomogeneity. HFO is such a system. Furthermore, 0.7T open systems suffers from poor S/N compared to conventional 1.5T magnets. This loss of S/N makes the phase difference images extremely noisy, and combined with HFO's degraded background homogeneity, forces a more sophisticated approach to AutoShim.

Conventional Autoshim does not unwrap phase difference images and only controls linear gradients. While these systems may estimate linear components in the field from local information relatively accurately, this estimation process is less than ideal because each linear gradient is estimated independently from an average of many local linear fits.

The system and method of the present invention will make Autoshim more effective for systems suffering degraded S/N due to low field strength, systems suffering severe background field inhomogeneity, and also for systems suffering large susceptibility errors due to particularly high field strength. The segmentation routine eliminates noisy pixels, while the phase unwrapping increases the range of field inhomogeneity that AutoShim can detect and therefore, correct.

The system and method will also improve open MRI systems significantly. Open MRI systems, such as OpenSpeed, use a quadratic "z2" coil which requires the Autoshim's phase difference images to be fit to a nonlinear function. Unwrapping phase difference images in accordance with the present invention will allow a simultaneous least-squares fit of all desired gradients (both linear and nonlinear). This will enable the fitting of the nonlinear "z2" coefficient and improve accuracy of the linear fits.

The present invention is also able to perform phase unwrapping of an image which contains noise. The unwrapping procedure is performed independent of noise levels. However, noisy data is masked out during the segmentation step.

Other modifications and variations to the invention will be apparent to those skilled in the art from the foregoing disclosure. Thus, while only certain embodiments of the invention have been specifically described herein, it will be apparent that numerous modifications may be made thereto without departing from the spirit and scope of the invention.

We claim:

1. A method for processing digital images, comprising:

acquiring a phase difference image which includes one or more wraps;

creating a modulated phase difference image from said phase difference image;

comparing said modulated phase difference image to said phase difference image to locate overlapping areas in said phase difference image to be unwrapped; and unwrapping said phase difference image based on the overlapping areas located in said comparing step.

2. The method of claim 1, wherein said phase difference image is a magnetic resonance image.

3. The method of claim 2, wherein said magnetic resonance image is an image derived from an open MRI system.

4. The method of claim 1, wherein said phase difference image is an X-ray image.

5. The method of claim 1, wherein said phase difference image is an ultra-sound image.

6. The method of claim 1, wherein said phase difference image derives from a synthetic aperture radar system.

7. The method of claim 1, wherein said creating step includes:

rotating said phase difference image by a predetermined angle.

8. The method of claim 7, wherein said creating step further includes:

registering the pixels in said rotated phase difference image so that values of said pixels lie within a desired phase range, said registered phase difference image corresponding to said modulated phase difference image.

9. The method of claim 8, wherein said desired phase range equals a phase range within which pixels of said phase difference image reside.

10. The method of claim 7, wherein said rotating step includes rotating said phase difference image in accordance with the following equation:

$$\phi_{mod} = (\phi + \theta) \bmod 2\pi$$

wherein $\phi_{mod}$ is said modulated phase difference image, $\phi$ is said phase difference image, and $\theta$ is a predetermined angle of rotation.

11. The method of claim 10, wherein $\theta$ lies between 0 and $2\pi$.

12. The method of claim 10, wherein $\theta$ is $\pi$.

13. The method of claim 1, wherein said comparing step includes:

defining image segments in said phase difference image;

defining image segments in said modulated phase difference image; and determining areas where the image segments in said phase difference image overlap the image segments in said modulated phase difference image.

14. The method of claim 13, wherein said first defining step includes:

masking out pixels located near said one or more wraps of said phase difference image to yield said image segments; and wherein said second defining step includes:

masking out pixels located near said one or more wraps of said modulated phase difference image to yield said image segments.

15. The method of claim 1, wherein said unwrapping step includes:

replacing pixels in said overlapping areas of said phase difference image with pixels in said modulated phase difference image plus an integer multiple of $\pi$.

16. The method of claim 15, further comprising:

computing said integer multiple of $\pi$ as a function of the average difference between values of pixels in said phase difference image and pixels in said modulated phase difference image.

17. A system for processing digital images, comprising:

a storage unit which stores a digital image; and a processor for processing the digital image under control of a computer program, said processor:

(a) generating a phase difference image from the digital image, said phase difference image including one or more wraps, (b) creating a modulated phase difference image from said phase difference image, and (c) comparing said modulated phase difference image to said phase difference image to locate overlapping areas in said phase difference image to be unwrapped, and (d) unwrapping said phase difference image based on the overlapping areas located in (c).

18. The system of claim 17, wherein the digital image is a magnetic resonance image.

19. The system of claim 18, wherein the magnetic resonance image is an image derived from an open MRI system.

20. The system of claim 17, wherein the digital image is an X-ray image.

21. The system of claim 17, wherein the digital image is an ultra-sound image.

22. The system of claim 17, wherein the digital image is a synthetic aperture radar system.

23. The system of claim 17, wherein said processor creates said modulated phase difference image by rotating said phase difference image by a predetermined angle.

24. The system of claim 23, wherein said processor rotates said phase difference image in accordance with the following equation:

$$\phi_{mod} = (\phi + \theta) \bmod 2\pi$$

wherein $\phi_{mod}$ is said modulated phase difference image, $\phi$ is said phase difference image, and $\theta$ is a predetermined angle of rotation.

25. The system of claim 24, wherein $\theta$ lies between 0 and $2\pi$.

26. The method of claim 24, wherein $\theta$ is $\pi$.

27. The system of claim 23, wherein said processor registers pixels in said rotated phase difference image so that values of said pixels lie within a desired phase range, said registered phase difference image corresponding to said modulated phase difference image.

28. The system of claim 27, wherein said desired phase range equals a phase range within which pixels of said phase difference image reside.

29. The system of claim 17, wherein said processor unwraps said phase difference image by replacing wrapped pixels in said phase difference image with pixels in said modulated phase difference image plus an integer multiple of $\pi$.

30. The system of claim 17, wherein said processor compares said modulated phase difference image to said phase difference image by:

defining image segments in said phase difference image, defining image segments in said modulated phase difference image; and determining areas where the image segments in said phase difference image overlap the image segments in said modulated phase difference image.

31. The system of claim 30, wherein said processor unwraps said phase difference image by replacing wrapped pixels in said overlapping areas of said phase difference image with pixels in said modulated phase difference image plus an integer multiple of π.

32. The system of claim 31, wherein said processor computes said integer multiple of π as a function of the average difference between values of pixels in said phase difference image and pixels in said modulated phase difference image in the overlapping area.

33. The system of claim 30 wherein said first defining step includes:

masking out pixels located near said one or more wraps of said phase difference image to yield said image segments; and wherein said second defining step includes:

masking out pixels located near said one or more wraps of said modulated phase difference image to yield said image segments.

34. A computer-readable medium including a computer program for processing digital images, said computer program including:

a first code section for acquiring a phase difference image which includes one or more wraps;

a second code section for creating a modulated phase difference image from said phase difference image;

a third code section for comparing said modulated phase difference image to said phase difference image to locate areas in said phase difference image to be unwrapped; and a fourth code section for unwrapping said phase difference image based on the overlapping areas located in said comparing step.

* * * * *